United States Patent
Bergman (10) Patent No.: US 6,401,732 B2
(45) Date of Patent: Jun. 11, 2002

(54) THERMOCAPILLARY DRYER

(75) Inventor: Eric J. Bergman, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/741,615

(22) Filed: Dec. 19, 2000

Related U.S. Application Data (62) Division of application No. 09/392,966, filed on Sep. 9, 1999, now Pat. No. 6,192,600.

(51) Int. Cl.⁷ .................................. B08B 3/04
(52) U.S. Cl. .................. 134/61; 134/95.2; 134/105; 134/902
(58) Field of Search .................. 34/267, 268, 343, 34/348, 516, 357, 420, 448, 449, 468, 481, 510, 519, 73, 77, 78, 273, 274; 134/61, 95.2, 105, 902

(56) References Cited

U.S. PATENT DOCUMENTS

| | | |
|---|---|---|
| 4,643,774 A | 2/1987 | Kishida et al. |
| 4,722,752 A | 2/1988 | Steck |
| 4,736,758 A | 4/1988 | Kusuhara |
| 4,778,532 A | 10/1988 | McConnell et al. |
| 4,841,645 A | 6/1989 | Bettcher et al. |
| 4,984,597 A | 1/1991 | McConnell et al. |
| 5,301,701 A | 4/1994 | Nafziger |
| 5,369,891 A | 12/1994 | Kamikawa |
| 5,371,950 A | 12/1994 | Schumacher |
| 5,421,905 A | 6/1995 | Ueno et al. |
| 5,443,540 A | 8/1995 | Kamikawa |
| 5,487,398 A | 1/1996 | Ohmi et al. |
| 5,556,479 A | 9/1996 | Bran |
| 5,569,330 A | 10/1996 | Schild et al. |
| 5,575,079 A | 11/1996 | Yokomizo et al. |
| 5,653,045 A | 8/1997 | Ferrell |
| 5,657,553 A | 8/1997 | Tarui et al. |
| 5,714,203 A | 2/1998 | Schellenberger et al. |
| 5,727,578 A | 3/1998 | Matthews |
| 5,752,532 A | 5/1998 | Schwenkler |
| 5,934,299 A * | 8/1999 | Akatsu et al. ........... 134/902 X |
| 5,940,985 A | 8/1999 | Kamikawa |
| 5,958,146 A | 9/1999 | Mohindra et al. |
| 6,139,645 A * | 10/2000 | Leenaars et al. ........ 134/902 X |

FOREIGN PATENT DOCUMENTS

EP      0 385 536 A1     9/1990

\* cited by examiner

Primary Examiner—Philip Coe
(74) Attorney, Agent, or Firm—Lyon & Lyon LLP

(57) ABSTRACT

A process and apparatus for drying semiconductor wafers, includes the controlled-rate extraction of a wafer immersed in rinsing liquid, irradiation of the wafer using high intensity lights or filaments along the wafer-liquid interface, and delivery of gas streams against the wafer along the wafer-liquid interface using a gas delivery system. Heating is controlled to create a temperature gradient without evaporating rinsing fluid adhering to surfaces of the wafer. Heating by the radiation sources creates a temperature gradient in the wafer in the irradiated region that simultaneously generates a surface tension gradient in the water adhering to the wafer. The gas delivery system removes the bulk of the water adhering to the wafer surface, and also suppresses the height of the rinsing liquid adhering to the wafer, providing faster extraction of dry and highly clean wafers from the rinsing liquid. A solvent vapor is optionally injected at the wafer-liquid interface, to reduce adhesion of the liquid to the vapor.

22 Claims, 8 Drawing Sheets

THERMOCAPILLARY DRYER

This application is a Divisional of Ser. No. 09/392,966, filed Sep. 9, 1999, now U.S. Pat. No. 6,192,600.

FIELD OF THE INVENTION

The present invention relates to the drying of semiconductor wafers or similar items following wet processing.

BACKGROUND OF THE INVENTION

One of the most critical steps in the wet-processing of semiconductor device wafers is the drying of the wafers. An ideal drying process would leave absolutely no contaminants on the wafer surfaces, while operating quickly, safely, and with no environmental or safety risks. In practice, deionized (DI) water is most frequently used as the process liquid. Most liquids such as DI water will "cling" to wafer surfaces in sheets or droplets due to surface tension following extraction of the wafer from a liquid bath. In other words, the liquid will "wet" the solid surface so long as the adhesion of liquid molecules on the surface of the solid is greater than the cohesion of the liquid molecules.

Changing the phase of the process liquid to gas (vapor) phase reduces the drying problems inherently caused by surface tension. Phase transitions, however, have long been acknowledged as having a high probability of allowing contaminants entrained in the surface boundary layer of the liquid to deposit on and adhere to the wafer surface, resulting in a higher rate of defects in the end product electronic devices. Various technologies have been developed in an attempt to control the phase transition, to reduce the level of contaminants left on the wafer surface after drying.

The following drying technologies have been used in the past:

A. Hot Water Dryers.

These dryers operate quite simply. Wafers are immersed in a hot bath of DI water, and as they are slowly withdrawn from the bath, the water retained on the wafer surface due to surface tension is evaporated from the heated silicon surface. However, hot DI water attacks silicon surfaces, rendering this technology largely useless for the fabrication of most semiconductor devices.

B. Spin-Rinse Dryers.

These dryers operate on two fundamental mechanisms. First, bulk liquid is removed from the wafer surface by spinning the wafer and generating centrifugal force. Once the bulk liquid has been removed, surface tension between the substrate and the residual liquid is greater than the level of centrifugal force which can be reasonably applied to the wafer. However, a second mechanism, evaporation, also comes into play. The evaporation rate is commonly increased by maintaining a relatively high rotational velocity on the wafer, thus improving convection. Heated nitrogen gas (N2) is typically injected into the process chamber to further increase evaporative drying.

This drying technology is limited, however, by the following factors: (1) it is unsuitable for drying hydrophobic surfaces, as minute water drops become isolated on the water surface and are difficult to remove, and contaminants entrained in such droplets are deposited on the wafer surface; (2) high spin velocity, which improves drying, generates high turbulence which can cause contaminants to deposit on the wafer surface; and (3) high mechanical stresses can be generated by the forces created from the high spin velocities, causing damage to the wafers, or generating contaminant particles.

C. Isopropyl Alcohol (IPA) Vapor Dryers.

These dryers operate by immersing wafers wetted with DI water into a heated environment saturated with IPA vapor. Liquid IPA has a significantly lower surface tension than that of water. As IPA starts to condense on the wafer surface, water which was present on this surface is displaced by IPA. When the water has been displaced by IPA, the wafers are then withdrawn through a cool zone which completes the condensation of the alcohol and causes it to flow off of the wafer surface.

This drying technology is limited by the following factors: (1) it involves the inherent hazard of using IPA, a flammable liquid, to be boiled at a temperature well in excess of its flash point; (2) it requires the consumption of IPA at relatively high rate; (3) it creates relatively high fugitive organic vapor emissions.

D. Marangoni Dryers.

These dryers essentially create an alcohol enriched interface at surface of the rinse liquid. As the wafers are withdrawn through the interface, the alcohol helps to displace water, reduces surface tension on the water surface, and allows water to be "pulled" from the wafer surface through cohesive attraction with the bulk liquid. This technology, however, also have fugitive organic emission problems inherent with any drying process that requires the utilization of alcohol.

E. Bran, U.S. Pat. No. 5,556,479, discloses a wafer drying process involving the slow draining of a rinsing fluid from a processing tank while heating portions of the wafer surfaces which are in contact with a fluid interface as air or another gas replaces the process fluid. In this process, the wafer is heated at the fluid interface up to a sufficient temperature to produce convection currents in the process fluid. The wafer is preferably displaced from the rinsing fluid at a rate no faster than 7 or 8 centimeters per minute. Consequently, the manufacturing throughput rates with this technique are lower than desired.

In light of the limitations inherent to these and other drying processes, it is an object of the present invention to provide a novel process and apparatus for drying semiconductor wafers or similar items quickly and safely while leaving minimal levels of particle contaminants or chemical residue.

It is a further object of the invention to accomplish such drying while reducing the hazards and emissions associated with drying wafers or similar items using chemicals.

SUMMARY OF THE INVENTION

To these ends, an apparatus for drying semiconductor wafers, according to a first aspect of the invention, includes an immersion vessel containing rinsing fluid, one or more heat sources for heating the wafer, and a gas delivery system for directing a stream of gas against the wafer as it moves upwardly relative to the rinsing fluid. Preferably, actuators and wafer supports are provided to withdraw the wafer upward from the rinsing fluid at a controlled rate.

In a second aspect of the invention, the gas delivery system and heat source are activated simultaneously as the wafer starts to move upward relative to the rinsing fluid. The heating creates a temperature gradient in the wafer that simultaneously generates a surface tension gradient in the water adhering to the wafer. Cohesive attraction within the liquid, coupled with gravity, draw the rinsing fluid away from the exposed wafer surface and into the rinsing fluid bulk. This process dries the wafer surface quickly by capillary action, as opposed to evaporation, thus yielding a highly clean wafer. The gas delivery system directs a gas, preferably nitrogen, downwardly to the wafer-fluid interface. The gas delivery system advantageously removes the bulk of the water adhering to the wafer surface, and also drives down the rinsing liquid adhering to the wafer.

In a third aspect of the invention, a solvent or other surface tension reducing vapor is provided to flow at the wafer-fluid interface, to further reduce the tendency of the fluid to cling to the wager.

BRIEF DESCRIPTION OF THE DRAWINGS

Other objects and features of the present invention will become apparent from the following detailed description taken in conjunction with the accompanying drawings which disclose embodiments of the invention. It is to be understood, however, that the drawings are designed for the purpose of illustration only and are not intended as a definition of the limits of the invention.

In the drawings, where the same reference characters denote the same elements, throughout the several views.

DETAILED DESCRIPTION OF THE PREFERRED EMBODIMENT

Figure 1:
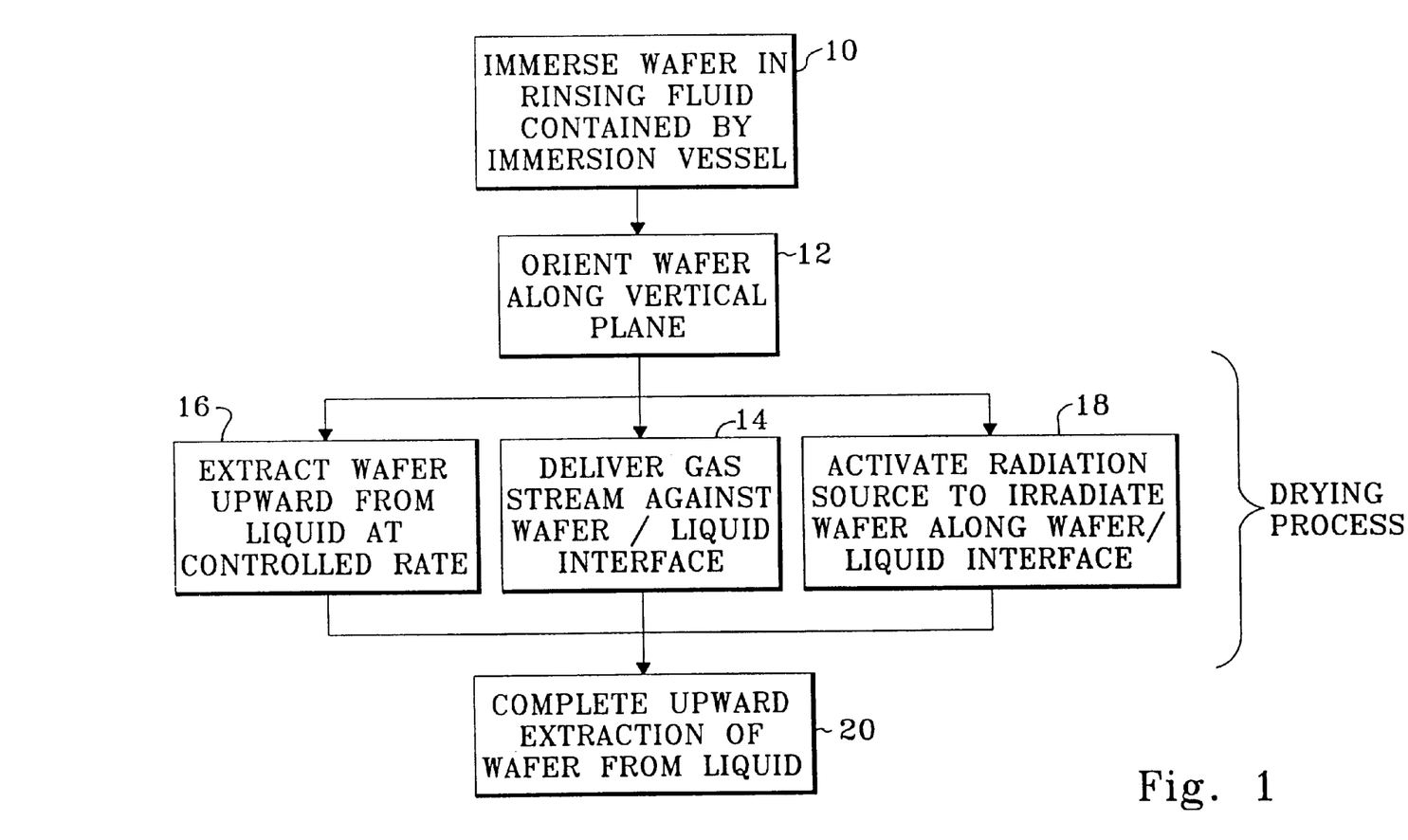
FIG. 1 is a diagram illustrating the processing steps of the thermocapillary drying method of the present invention.

FIG. 1 illustrates the basic steps of a semiconductor wafer drying method in accordance with one aspect of the present invention. Although the drying process is described here in reference to the wet processing of semiconductor wafers, it applies as well to other articles such as disks, substrates, panels, etc. The term "wafers" here includes these and other similar articles.

Referring now in detail to FIG. 1, at least one wafer is placed in an immersion vessel and immersed in liquid contained within this vessel, as represented in step 10. Although the wafer may undergo several wet processing steps in this vessel or others, the final wet processing step usually includes the immersion of the wafer in a rinsing liquid. At the conclusion of what may be several rinsing cycles, the last rinsing cycle typically uses deionized water. If not already oriented vertically, the wafer is oriented along a substantially vertical plane to prepare it for drying, as shown in step 12. This orientation allows gravity to assist the drying process along both faces of the wafer. Substantially vertical means in a position such that the effect of gravity contributes to the drying process.

The next step in the drying process advantageously includes three procedures, preferably performed simultaneously. A gas stream is delivered against the wafer/liquid interface. This gas removes the bulk of the water adhering to the wafer surface, and also suppresses the height of the rinsing liquid that continues to adhere to the wafer. The gas is preferably delivered to the wafer/liquid interface from nozzles or ducts positioned above the wafer/liquid interface. While a variety of different gases can be used, preferably the gas is relatively inert, so as to minimize the potential for reaction with the wafer, rinsing fluid, or any contaminants present. Argon may be used, but it is expensive. Filtered air may be used at minimum expense, but it includes oxygen which can react with other materials. Carbon dioxide or nitrogen are advantageous due to their low cost and low reactivity.

On a batch of 25 wafers, a typical gas flow rate would be between 50 and 200 slpm. The flow would be scaled appropriately for larger load sizes. However, going to very low flows is difficult, so in a single-wafer application the flow rate would still be round 25–50 slpm. Since the delivery across the wafer is affected by the inertia of resident gas at the wafer interface, the gas flow must be adequate to overcome the inertia of the resident gas and establish a flow from the delivery point to the wafer/liquid interface.

The second preferably simultaneous procedure is the controlled upward extraction of the wafer from the rinsing liquid, as represented in step 14 of FIG. 1. Control of the extraction rate is necessary to ensure that the wafer dries cleanly. If the extraction rate is too fast, then the rinsing fluid may leave residue streaks and spots. If the extraction rate is too slow, manufacturing efficiency suffers. Using a drying apparatus including a heating light and gas delivery system to test the drying of one segment of a wafer, it has been found that satisfactory results (i.e. particle additions averaging less than 1 particle added per pass) may be obtained by limiting the extraction rate of the wafer to between 8 and 15 cm/min. In some applications, extraction rates may be increased to between 8 and 30 cm/min. and more specifically to between 15 and 30 cm/min. The extraction rate will be highly dependent on the processor configuration, which will impact the wafer surface temperature, the delivery efficiency of the gas stream to the wafer/liquid interface, the use of additives such as IPA vapor, the device geometries to be dried (deep and high density geometries tend to trap more water, so the extract rate will be slower). Of course, the extraction should be as fax as possible to maximize equipment throughput. The higher extraction speeds may be reached, depending on the application, with a combination of reduced surface tension through IPA vapor and thermocapillary principles.

The third preferably simultaneous procedure is the activation of a radiation source to irradiate the wafer along the wafer/liquid interface, as in step 18 of FIG. 1. The radiation source heats the wafer in the irradiated region, creating a temperature gradient in the wafer that simultaneously generates a surface tension gradient in the water adhering to the wafer. The radiation or heat source is preferably an electrical resistive heating element, such as a wire filament, a solid state heater or a resistive heating element deposited on or in an insulator, such as ceramic or quartz.

Due to cohesion, liquids tend to migrate away from low surface tension regions (where adhesion is low) toward regions with a high surface tension (where adhesion is high).

The surface tension gradient created by the radiant heating causes cohesive attraction within the liquid, to draw the rinsing fluid away from the exposed wafer surface and into the rinsing fluid bulk. The wafer is preferably heated at a relatively low heating rate to minimize the acceleration of evaporative heating, since evaporation tends to cause contaminants entrained in the rinsing fluid to be deposited on the wafer surface. The heating rate should be as fast as possible to the specified heating point. From a purely scientific perspective, the higher the thermal gradient, the higher the surface tension gradient and the more efficient the thermocapillary dry will be. However, practical constraints limit the heating rate. The wafer surface temperature will ideally remain below 200C to control evaporative drying and the diffusion of mobile ions in the semiconductor device structure. Preferably, the temperature range is 100–250° C., and more preferably 125–225° C. or 150–200° C.

The preferably simultaneous procedures of upward extraction, gas delivery, and irradiation or heating are continued until upward extraction of the wafer from the rinsing liquid is complete, as shown in step 20 in FIG. 1. Upon full extraction, the wafer is dry and substantially free of contaminants.

Figure 2:
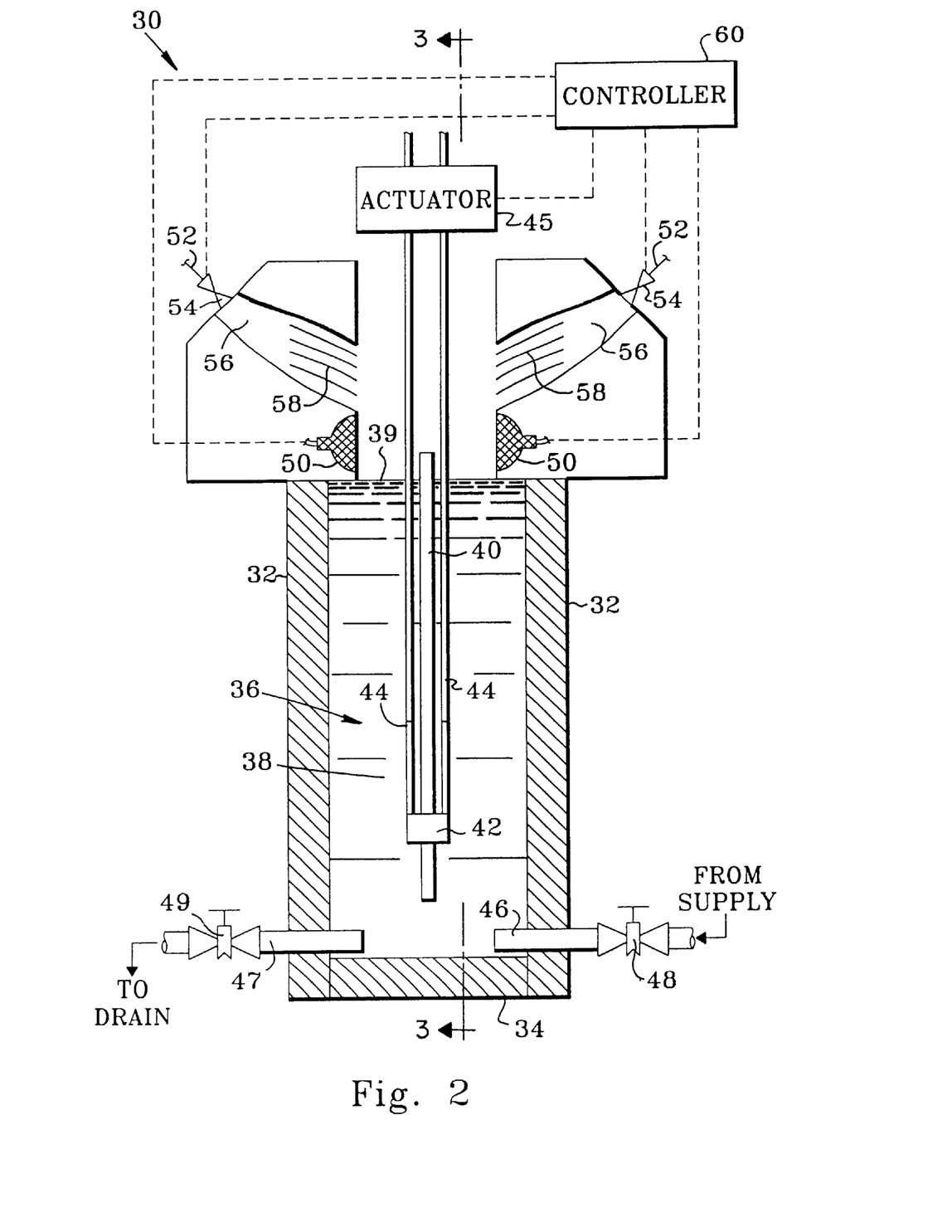
FIG. 2 is a schematic, cross-sectional, side elevation view of a wafer drying apparatus of the present invention.
Figure 3:
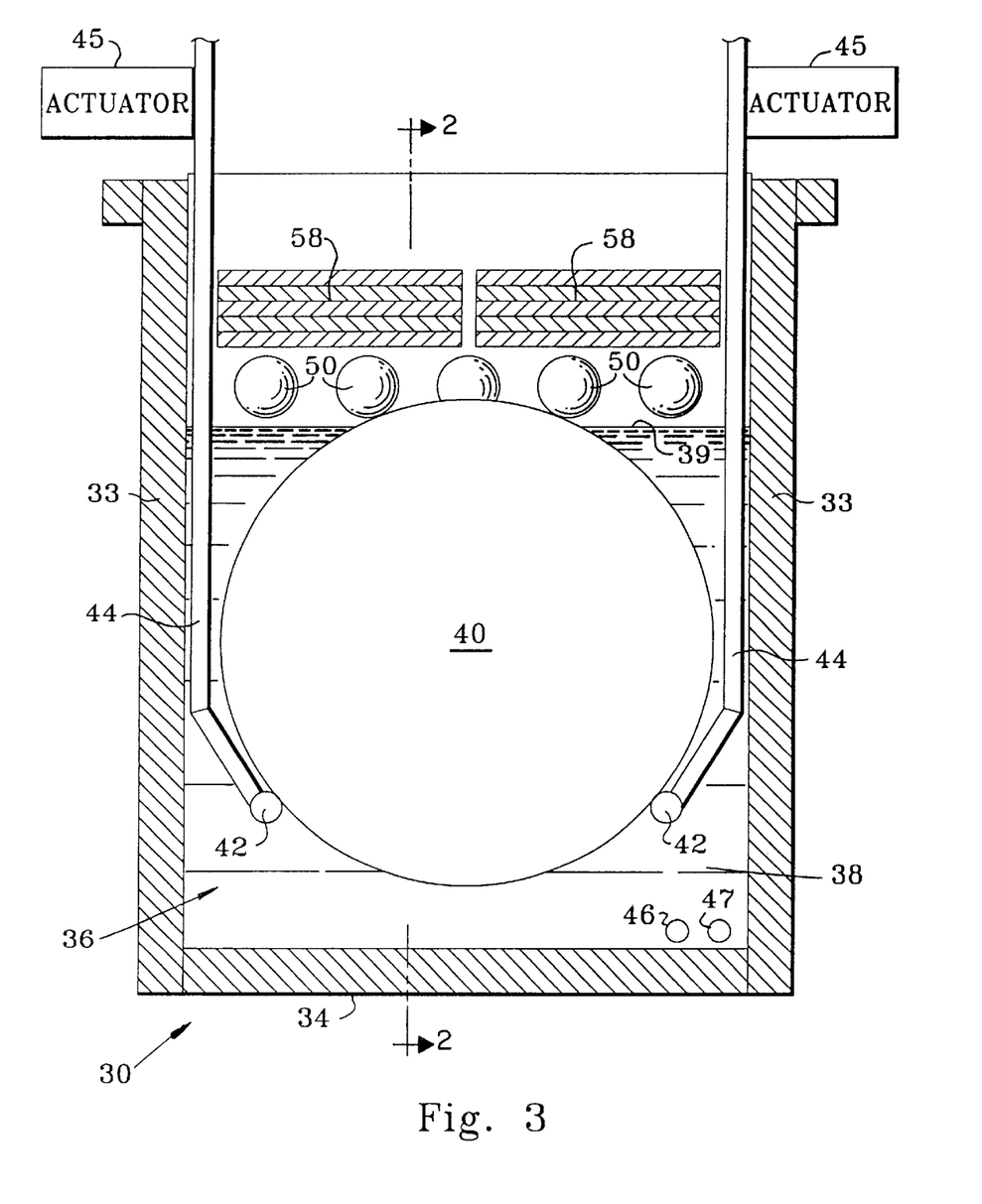
FIG. 3 is a schematic, cross-sectional, front elevation view of the wafer drying apparatus of FIG. 2.

FIGS. 2 and 3 illustrate a wafer drying apparatus 30 incorporating a preferred drying method. FIG. 3 illustrates the view along section line "A—A" of FIG. 2, and FIG. 2 illustrates the view along section line "B—B" of FIG. 3.

A wafer 40 is shown partially immersed in rinsing liquid 38 contained by an immersion vessel 36 having side walls 32, end walls 33, and bottom walls 34. Rinsing liquid 38 may be supplied to the immersion vessel 36 as necessary through a supply line 46 and a supply valve 48, and in turn may be drained from the vessel 36 through a drain line 47 and a drain valve 49. The wafer 40 is supported by wafer supporting members 42, which are suspended by supporting links 44. The supporting links 44 are further suspended from actuators 45 which can lower the wafer 40 into the immersion vessel or raise the wafer 40 from the immersion vessel 36 at a controlled rate. The actuators or links, in an alternative design, may be positioned in or under the vessel 38.

As the wafer 40 begins to slowly emerge from the rinsing liquid 38, high-intensity lights 50 are activated immediately above the wafer-liquid interface 39. These lights 50 preferably emit at least some radiation in the infrared range, since infrared light is typically well-absorbed by semiconducting materials used in wafers. Emission by the lights 50 of at least some radiation also in the visible spectrum is preferred, however, to provide for the safety of personnel who operate or maintain the drying apparatus 30. The heating provided by lights 50 should create a temperature gradient in rinsing liquid 38 adhering to the wafer 40 above the wafer-liquid interface 39, but should not heat the wafer 40 so much as to accelerate evaporation of the adhering liquid 38. Several small lights 50 along each side of the wafer 40 are preferable to the use of a single large lamp to provide for even heating of the wafer 40 and to reduce the overall height of the drying apparatus 30. Moreover, the use of small lights 50 allows the placement of gas delivery ducts 56 closer to the wafer-liquid interface 39 than would otherwise be permitted.

Simultaneously with the slow extraction of the wafer 40 from the immersion vessel 36 and the activation of the high-intensity lights 50, gas valves 54 advantageously open to deliver one or more gas streams against the wafer 40 along the wafer-liquid interface 39. Pressurized gas is delivered via gas lines 52 to the gas valves 54. From the gas valves 54, gas ducts 56 may be used to channel and partially expand the gas flow before discharging against the wafer 40. If ducts 56 are used, they preferably extend substantially across the width of the wafer 40 and are short in height relative to the width of the ducts 56. This duct configuration provides an even distribution of gas at relatively high velocity across the width of the wafer.

Vanes 58 may be used to turn or direct the gas stream or streams specifically against the wafer-liquid interface 39, preferably at an acute angle relative to the wafer 40. Delivery of the gas at an acute angle relative to the wafer 40 enhances removal of the bulk of the rinsing liquid 38 adhering to the surface of the wafer 40, and also enhances suppression of the height of the rinsing liquid 38 that continues to adhere to the wafer 40. In other words, directing the gas toward the wafer 40 at an acute angle relative to the wafer 40 when positioned in a vertical orientation allows the gas to assist the cohesion of the rinsing liquid 38 to itself while opposing adhesion of the rinsing liquid 38 to the wafer 40.

A controller 60 is provided with connections to the actuators 45, lights 50, and gas valves 54 to coordinate the advantageous simultaneous extraction of, irradiation of, and gas delivery to, the wafer 40. The controller 60 may be connected to additional devices to permit further processing of the wafer 40 after drying and extraction is complete.

Figure 4:
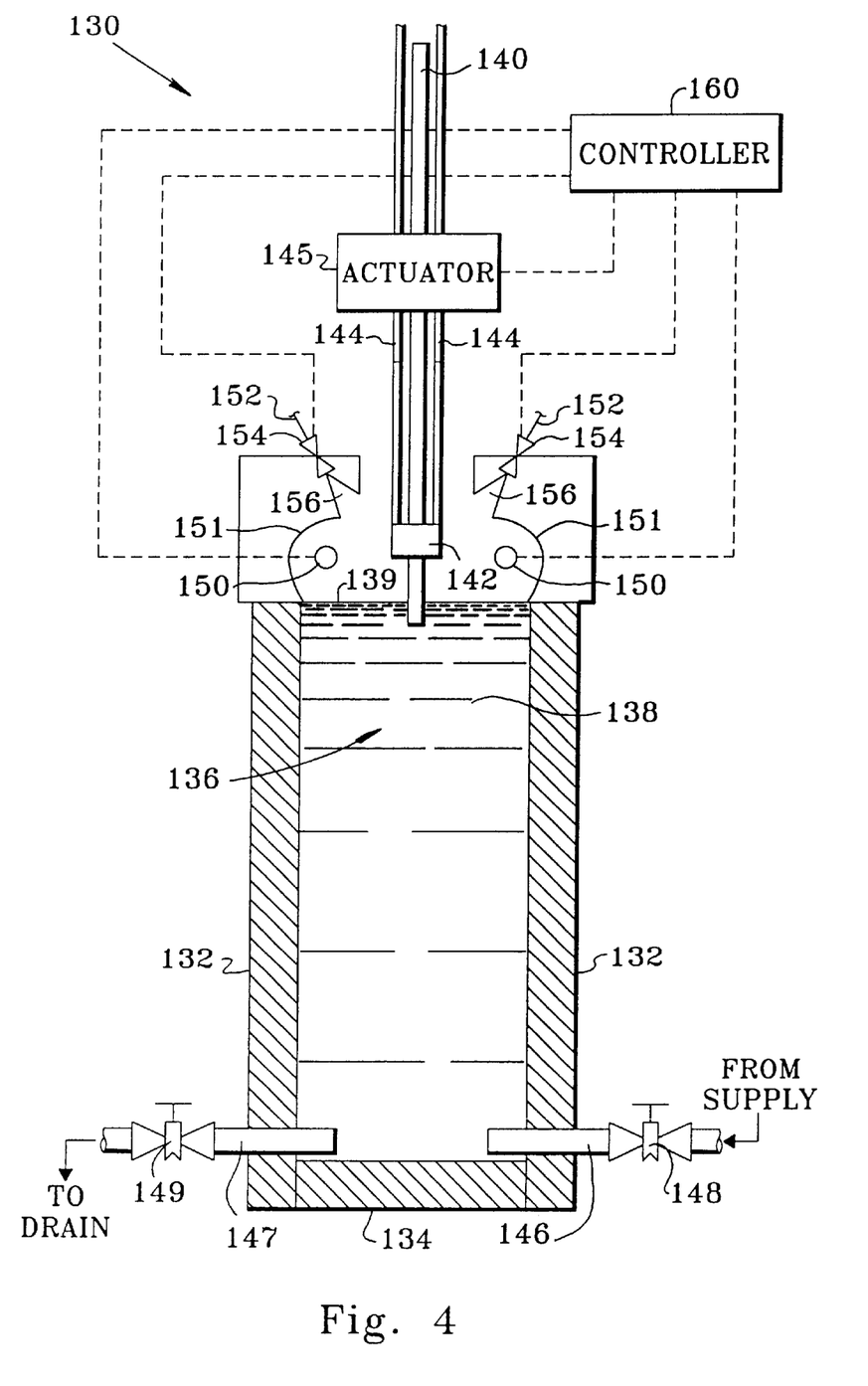
FIG. 4 is a schematic, cross-sectional, side elevation view of a first alternative wafer drying apparatus of the present invention.

FIG. 4 illustrates a first alternative wafer drying apparatus 130. The wafer 140 is illustrated as being almost fully extracted from the rinsing liquid 138 contained within the immersion vessel 136 having side walls 132 and a bottom wall 134. Operation of this apparatus 130 is similar to the procedure described in connection with FIGS. 2 and 3. However, the wafer 140 is irradiated via heated wire filaments 150, instead of lights, as it is slowly extracted upward via actuators 145, wafer supporting members 142, and supporting links 144. Reflectors 151, preferably curved in shape, are provided behind filaments 150 to enhance heating of the wafer 140 along the wafer-liquid interface 139.

Preferably simultaneously with the extraction and heating, gas is supplied to the wafer 140 along the wafer-liquid interface 139 via gas lines 152, gas valves 154, and gas ducts 156. Several gas ducts 156 may be present along each side and across the width of the apparatus 130 to provide even distribution of gas along the width of the wafer 140. The gas ducts 156 preferably direct gas to the wafer 140 at an acute angle relative to each surface of the wafer 140. The gas valves 154 may be replaced with a single valve positioned remotely from the wafer 140, with appropriate substitute gas piping, to reduce overall cost of the apparatus 130. A controller 160 is provided to coordinate the simultaneous extraction of, irradiation of, and gas delivery to the wafer 140. A supply valve 148, supply line 146, drain line 147, and drain valve 149 are also provided to supply and drain rinsing liquid. The actuators 160, filaments 150, and gas valves 154 are connected to, and controlled by, a controller 160.

Figure 5:
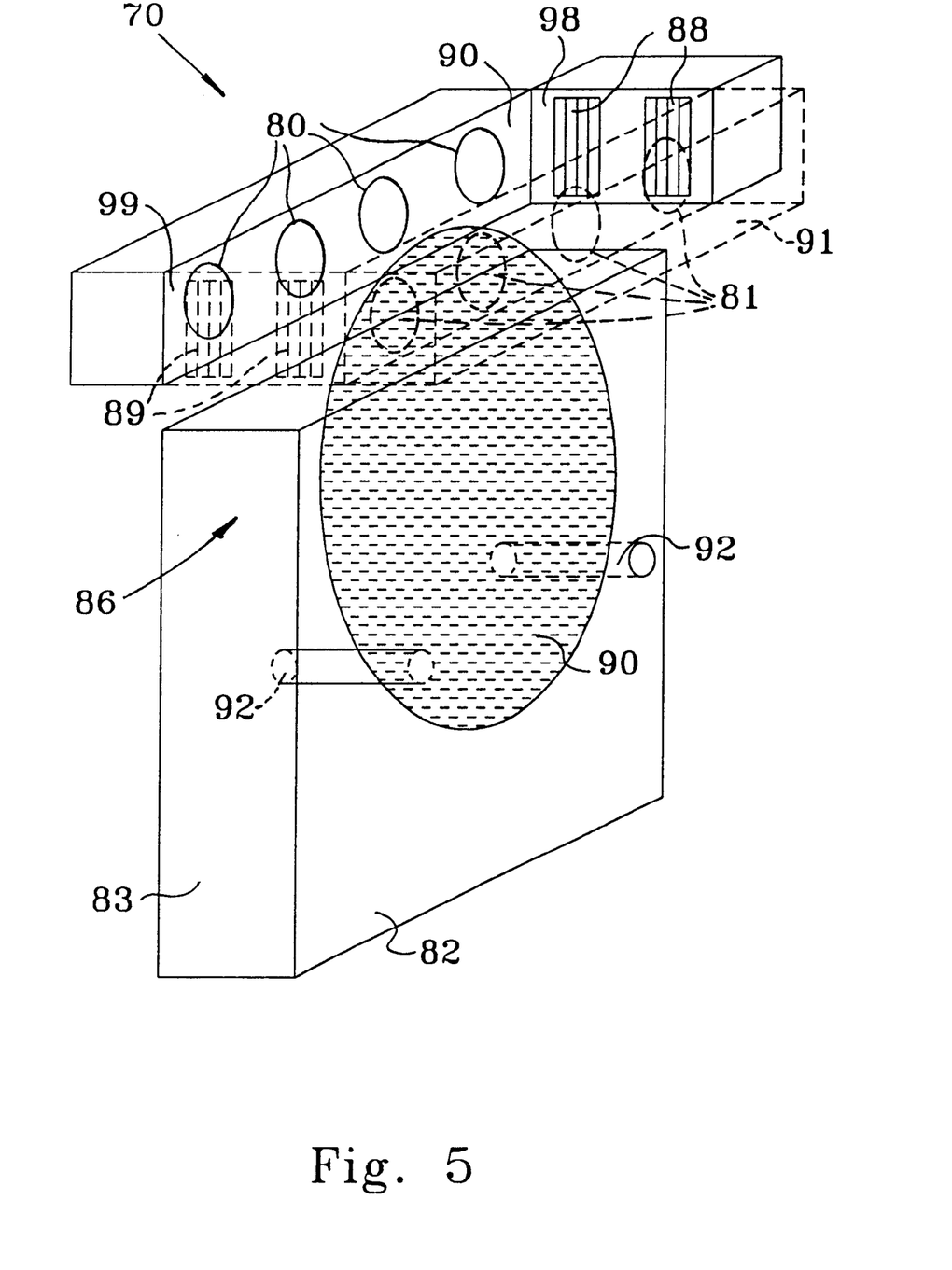
FIG. 5 is a schematic, perspective, partially exploded view of a second alternative wafer drying apparatus of the present invention.

FIG. 5 illustrates a partially exploded schematic view of a second alternative wafer drying apparatus 70. This apparatus is similar to the apparatus 30 described in FIGS. 3 and 4. The wafer 90 is illustrated as being partially extracted from the immersion vessel 86 and supported by wafer supporting members 92. Multiple high intensity lights 80, 81 are positioned in banks 90, 91 above side walls 82 to irradiate each side of the wafer 90 as it is extracted from the vessel 86 at a controlled rate. Preferably, simultaneously with the extraction and irradiation of the wafer 90, pressurized gas is supplied to the wafer 90 through gas ducts 88, 89, which are positioned along the end walls 83 of the immersion vessel 86, rather than above the lights 80 along the side walls 82 as in the previous embodiments. Configuring the gas ducts 88, 89 in this position reduces the overall height of the apparatus 70. Preferably, vanes (not shown) are employed within gas ducts 88, 89 to direct gas in a downward direction and against each side of the wafer 90. Extraction, irradiation, and gas delivery is performed until the wafer 90 is withdrawn completely from the immersion vessel 86.

Figure 6:
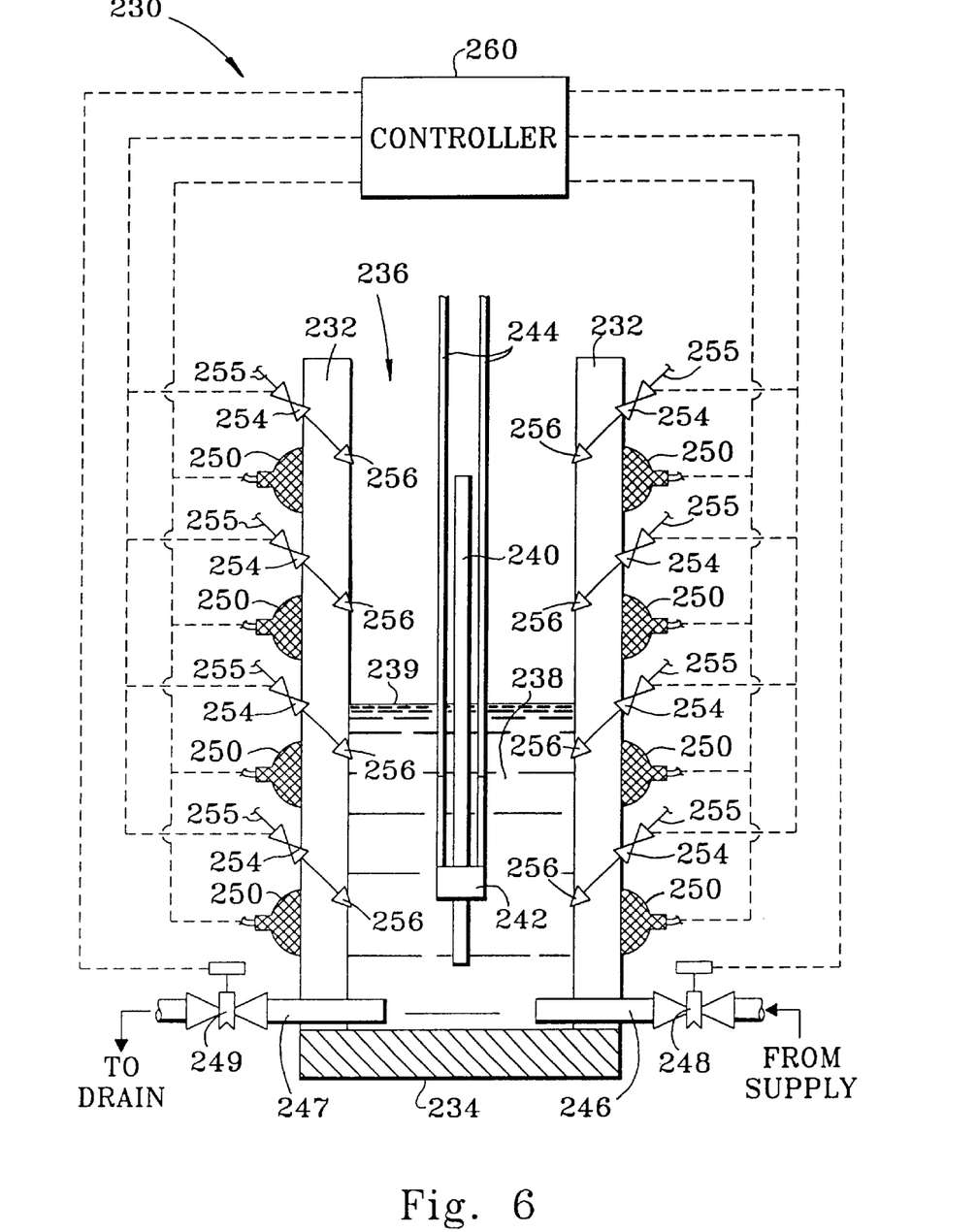
FIG. 6 is a schematic, cross-sectional, side elevation view of a third alternative wafer drying system of the present invention.

FIG. 6 illustrates a third alternative wafer drying apparatus 230. In this embodiment, relative motion between the wafer 240 and the rinsing liquid 238 is accomplished by slowly draining the rinsing liquid 238 away from the immersion vessel 236, which has translucent side walls 232. From a drying perspective, the slow draining of the rinsing liquid 238 away from the immersion vessel 236 is functionally equivalent to the slow extraction of the wafer from the rinsing liquid 238. Since the wafer 240 must eventually be extracted from the immersion vessel 236 for further processing, however, achieving relative motion of the wafer-liquid interface by slow extraction is generally preferable to slow draining. The drying apparatus 230 therefore still requires wafer supporting members 242 and supporting links 244 to support the wafer 240 and to extract the wafer following completion of the drying process.

The immersion vessel 236 must permit transmission of radiant energy from the several lights 250 that are positioned in multiple rows along the side walls 232 to irradiate the wafer 240 along the wafer-liquid interface 239 as the rinsing liquid 238 water is slowly drained away. Accordingly, the side walls 232 are preferably made from a durable material which is transparent to infrared and is non-reactive with the rinsing fluid 238 contained within the immersion vessel 236. Suitable materials for the side walls 232 include transparent quartz and sapphire. Draining of the rinsing fluid from the immersion vessel 236 is performed by a drain valve 249, which is connected to a controller 260, and a drain line 247. Fresh rinsing fluid 238 may be supplied to the immersion vessel 236 via a supply line 246 and supply valve 248. Gas is supplied to the wafer 240 along the wafer-liquid interface 239 through gas lines 255, gas valves 254, and gas nozzles 256 which are positioned in multiple rows along the side walls 232 of the immersion vessel 236. To reduce cost and complexity, fewer gas valves 254 (as few as one per row) may be used to control the gas delivery so long as appropriate gas piping is provided. Preferably, gas is supplied to the wafer 240 at an acute angle relative to each surface of the wafer. The irradiating, draining, and gas supplying steps are preferably performed simultaneously.

Positioning the lights 250 and gas nozzles 256 in rows along the side walls 232 of the immersion vessel 236 permits the irradiation and gas delivery to be performed close to the wafer-liquid interface 239 as this interface 239 falls due to the draining of the rinsing fluid 238. Each row of lights 250 and gas nozzles 256 are preferably activated in series, with the topmost row being activated first, and then being deactivated as the second row is activated, and then the second row being deactivated as the next row is activated, and so on. Control of the lights 250, gas valves 254, and drain valve 249 is performed by the controller 260. The controller 260 also controls the supply valve to refill the immersion vessel 236 with rinsing liquid 238 to process one or more additional wafers when the drying process is complete.

Figure 7:
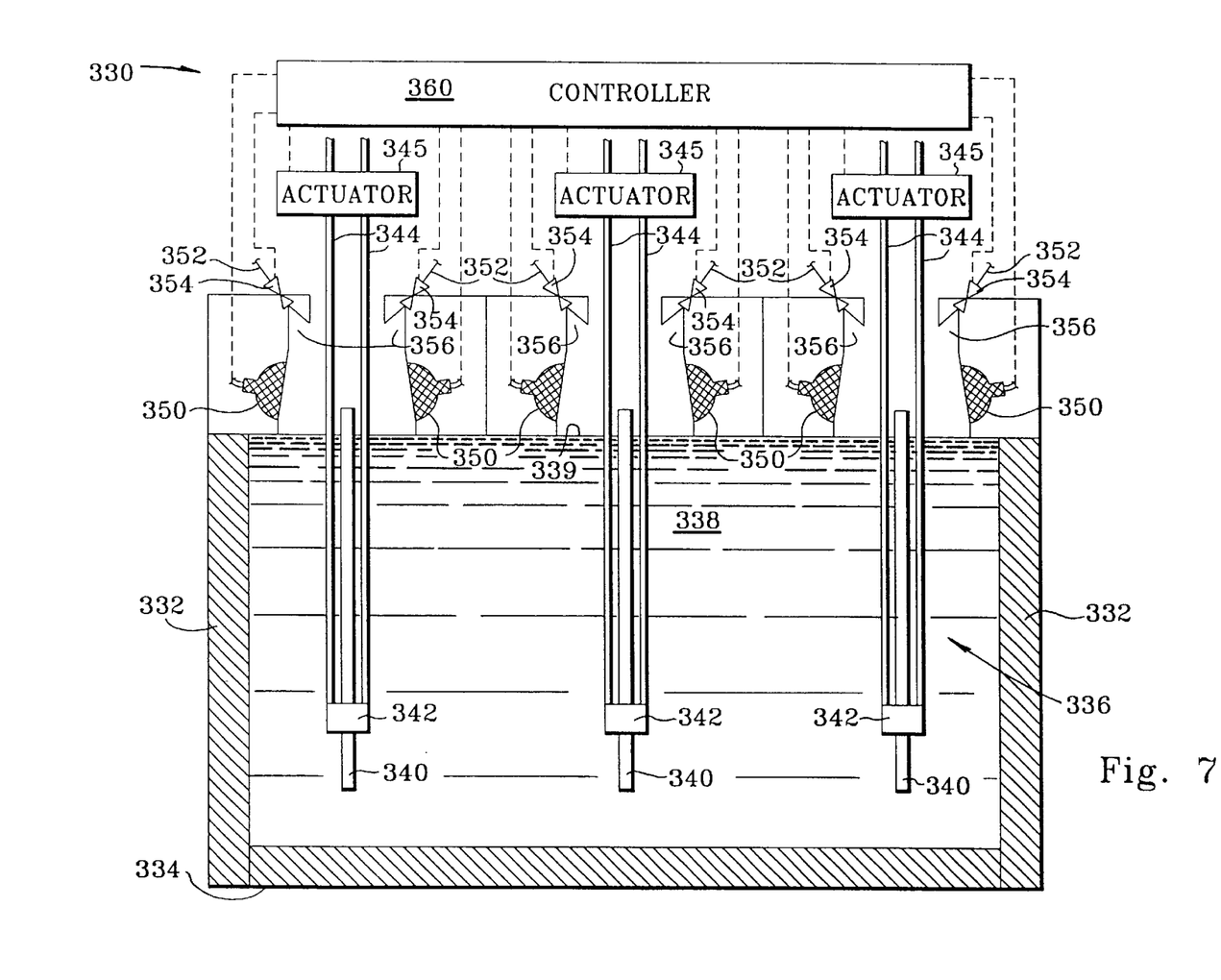
FIG. 7 is a schematic, cross-sectional, side elevation view of a fourth alternative wafer drying system for simultaneously drying multiple wafers.

FIG. 7 illustrates a fourth alternative wafer drying apparatus 330, which is capable of multiple wafers 342 simultaneously. A large immersion vessel 336, having side walls 332 and a bottom wall 334, contains rinsing liquid 338. The immersion vessel 336 may optionally have intermediate walls 335 between the wafers 340. Multiple wafers 342 are supported by wafer supporting members 342, which are in turn connected to supporting links 344 that descend from actuators 345. The wafers 342 are illustrated in a position where they have just started to be extracted from the rinsing liquid 338. Extraction of all of the wafers 340 may or may not be synchronized. As each wafer 340 is extracted, it is irradiated with radiant energy provided by lamps 350. In this embodiment, each of the lamps 350 is advantageously angled slightly toward the corresponding wafers 340 along each wafer-liquid interface 339.

Simultaneously with this extraction and irradiation, gas is delivered against each wafer 340 along the wafer-liquid interface 339, from gas supply lines 352, gas valves 354, and gas nozzles 356. The gas valves 354, which are connected to the controller 360, regulate the flow of gas. The controller 360 also controls the actuators 345 and lights 350. To reduce cost and complexity, fewer gas valves 354 may be used to control the gas delivery if appropriate gas piping is provided. As few as one gas valve 354 may be used if extraction of each wafer 340 is synchronized. As few as one gas valve 354 per wafer 340 may be used if it is desired not to extract all of the wafers 340 together.

Figure 8:
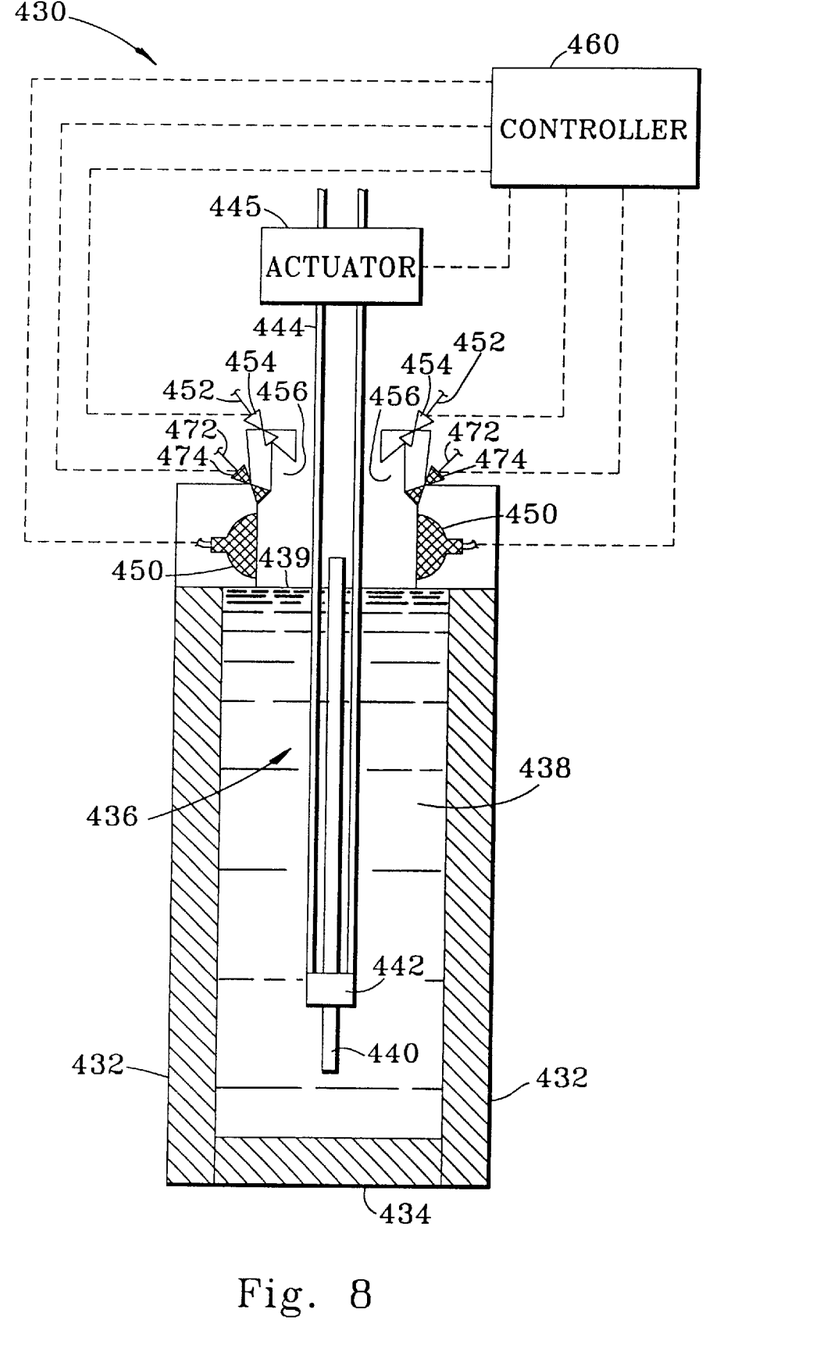
FIG. 8 is a schematic, cross-sectional, side elevation view of a fifth alternative wafer drying system of the present invention.

FIG. 8 illustrates a fifth alternative wafer drying apparatus 430 that includes the injection of a solvent vapor, such as isopropyl alcohol, to further aid the capillary drying of the wafer 440. An immersion vessel 436 having side walls 432 and a bottom wall 434 contains rinsing liquid 438 such as DI water. A wafer 440 is supported within the rinsing fluid by wafer supporting members 440, which are connected by supporting links 444 to actuators 445. The wafer 440 is illustrated as being partially extracted from the immersion vessel 436. High intensity lights 450 are positioned directly above side walls 432 to irradiate the wafer 440 as it is extracted from the immersion vessel 436 at a controlled rate by the actuators 445. Solvent vapor is injected against the wafer 440 along the wafer-liquid interface 439 to further reduce the adhesion of rinsing liquid to the wafer 440 (preferably simultaneously with the irradiation). As compared with the rinsing liquid 438, the solvent should be more volatile and have a lower surface tension, and it should also not react chemically with the wafer 440. Isopropyl alcohol is a preferable solvent. Solvent in liquid form may also be introduced to the interface, to aid in drying.

The solvent is delivered to the apparatus via solvent supply lines 472 and injected against the wafer using solvent vapor injectors 474 which deliver solvent in mist form. Upon contacting the surface of the wafer 440, the solvent induces a surface tension gradient that combines with the thermal surface tension gradient induced by the high intensity lights 450 to dry the wafer 440 by capillary action. Further aiding the capillary drying process is the delivery of gas simultaneous with the controlled extraction, irradiation, and vapor delivery. The gas is delivered against the wafer 440 along the wafer-liquid boundary 439 via gas supply lines 452, gas valves 454, and nozzles 456. Multiple lights 450, vapor injectors 474, and gas nozzles 456 are preferably arranged in rows along opposite sides of the wafer 440 to distribute radiation, vapor, and gas evenly along each surface of the wafer. The addition of the solvent vapor provides advantages in the form of faster and cleaner drying of the wafer 440, but also attendant disadvantages in handling fugitive emissions. Moreover, it may be necessary to limit the surface temperature of the lights 450, by insulation or active cooling, to ensure that the solvent vapor cannot be ignited.

Though the present invention has been described in terms of certain preferred embodiments, other embodiments apparent to those skilled in the art should also be considered as within the scope of the present invention. Elements and steps of one embodiment may also readily be used in other embodiments. Substitutions of steps, devices, and materials, will be apparent to those skilled in the art, and should be considered still to be within the spirit of the invention. Accordingly, the invention should not be limited, except by the following claims, and their equivalents.

What is claimed is:

1. An apparatus for drying at least one semiconductor wafer, the apparatus comprising:
    an immersion tank containing rinsing liquid;
    a support within said immersion tank for holding the wafer in a substantially vertical position;
    a lifter movable relative to the support to lift the wafer out of the liquid in the immersion tank, creating a wafer/liquid interface at the surface of said rinsing liquid;
    at least one heat source adjacent to the least one wafer and the liquid surface; and
    a gas delivery system having an opening to deliver a gas to the wafer at the interface.

2. The apparatus of claim 1, wherein said heat source comprises one or more banks of high-intensity electric lights.

3. The apparatus of claim 1, wherein said gas delivery system comprises:
    a reservoir of pressurized gas;
    at least one duct positioned above the wafer-liquid interface to deliver the at least one stream of gas from the reservoir to the wafer at the interface; and
    at least one valve to activate the flow of the gas to the at least one duct.

4. The apparatus of claim 3, wherein the at least one duct further comprises at least one nozzle to direct the gas to the wafer-liquid interface.

5. The apparatus of claim 3, wherein the at least one duct further comprises at least one louver member to direct the gas to the wafer-liquid interface.

6. The apparatus of claim 1, further comprising an alcohol vapor delivery system to deliver alcohol vapor against the wafer adjacent to the wafer/liquid interface.

7. An apparatus for drying at least one semiconductor wafer, the apparatus comprising:
    an immersion tank containing a rinsing liquid;
    a wafer holder within the immersion tank holding the wafer in a substantially vertical position;
    a drain valve for draining the rinsing liquid from the immersion tank at a controlled rate, creating a wafer/liquid interface at the surface of the rinsing liquid;
    at least one radiation source positioned to irradiate the at least one wafer along the wafer/liquid interface; and
    a gas delivery system having a gas outlet positioned to deliver at least one stream of gas against the wafer/liquid interface.

8. The apparatus of claim 7, wherein:
    the immersion tank comprises at least one vertical wall which allows the transmission of radiation in the infrared range;
    the at least one radiation source comprises infrared lights positioned behind the at least one vertical wall to transmit light into the immersion tank; and
    said gas delivery system comprises a plurality of ducts.

9. The apparatus of claim 8, wherein at least one of the plurality of ducts further comprises a nozzle positioned within the immersion tank.

10. The apparatus of claim 1 further comprising a drain valve for draining the rinsing liquid from the immersion tank at a controlled rate.

11. The apparatus of claim 1, wherein:
    the immersion tank comprises at least one vertical wall which allows the transmission of radiation in the infrared range;
    the at least one radiation source comprises an infrared light positioned behind the at least one vertical wall to transmit light into the immersion tank.

12. An apparatus for drying a wafer, comprising:
    an immersion tank;
    a support within immersion tank for holding the wafer;
    means for vertically moving the support relative to a rinsing liquid in the immersion tank, to create a wafer/liquid interface at the surface of the rinsing liquid;
    at least one heat source for heating the wafer at least at the wafer/liquid interface; and
    a gas delivery system for delivering a gas to the wafer/liquid interface.

13. The apparatus of claim 12 wherein the support holds the wafer in a substantially vertical position.

14. The apparatus of claim 12 wherein the heat source is a heating lamp positioned to heat the wafer adjacent to the wafer/liquid interface.

15. An apparatus for processing wafers, comprising:
    an immersion tank for holding a liquid;
    a support for holding the wafers, with the support relatively moveable from a first position, wherein the wafers on the support are at least partially immersed in the liquid in the immersion tank, to a second position, wherein the wafers on the support are entirely withdrawn from the liquid in the immersion tank;
    a heat source for heating the wafers at least at the surface of the liquid; and
    a gas delivery system to deliver a gas onto the wafers, adjacent to the liquid surface.

16. The apparatus of claim 15 where the support holds the wafers in a vertical position.

17. The apparatus of claim 15 where the heat source comprises an array of heat lamps positioned to heat the wafers at a wafer/liquid interface formed as the wafers are withdrawn from the liquid.

18. The apparatus of claim 15 wherein the gas delivery system has a gas outlet positioned to spray a gas onto the wafers at the liquid surface.

19. The apparatus of claim 15 further including a solvent delivery system having outlets for delivering a solvent into the immersion tank.

20. The apparatus of claim 15 further comprising control means for controlling movement of the support.

21. An apparatus for drying wafers having two planar surfaces, comprising:
    an immersion vessel containing a liquid bath;
    means for moving the wafers out of the liquid bath at a controlled rate, with a wafer/liquid interface forming on the planar surfaces of the wafers;
    a gas supply for delivering at least one stream of gas to the wafer/liquid interface; and
    a heater for heating at least one of the planar surfaces or the wafers at the wafer/liquid interface as the wafers are moved out of the liquid bath.

22. The apparatus of claim 21 wherein the at least one stream of gas is directed at the wafer/liquid interface at an acute angle relative to the wafers.

* * * * *